(12) United States Patent
Wang et al.

(10) Patent No.: US 10,727,280 B2
(45) Date of Patent: Jul. 28, 2020

(54) SUBSTRATE, METHOD OF MANUFACTURING THE SAME AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/990,775

(22) Filed: May 28, 2018

(65) Prior Publication Data

US 2019/0157353 A1    May 23, 2019

(30) Foreign Application Priority Data

Nov. 22, 2017   (CN) .......................... 2017 1 1176769

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3272* (2013.01); *H01L 51/525* (2013.01); *H01L 51/5234* (2013.01); *H01L 51/5284* (2013.01); *H01L 51/56* (2013.01); *H01L 27/3279* (2013.01); *H01L 51/5228* (2013.01); *H01L 2251/5315* (2013.01)

(58) Field of Classification Search
CPC ............... H01L 27/322; H01L 27/3272; H01L 27/3279; H01L 27/124; H01L 27/3276; H01L 51/5228; H01L 51/5234; H01L 51/56; H01L 51/525; H01L 51/5284; H01L 27/3253; H01L 27/1214; H01L 27/1274; H01L 27/1288; G02F 1/13394
See application file for complete search history.

(56) References Cited

U.S. PATENT DOCUMENTS

| | | | |
|---|---|---|---|
| 8,017,949 B2* | 9/2011 | Lee ................... | G02F 1/136209 257/59 |
| 8,455,046 B2* | 6/2013 | Chae ..................... | G02B 5/22 427/133 |
| 8,937,690 B2* | 1/2015 | Nam ................ | G02F 1/136286 349/12 |
| 2005/0094061 A1* | 5/2005 | Lee ................... | G02F 1/133512 349/106 |

(Continued)

FOREIGN PATENT DOCUMENTS

| CN | 1549035 A | 11/2004 |
|---|---|---|
| CN | 103700688 A | 4/2014 |

OTHER PUBLICATIONS

First Chinese Office Action dated Nov. 4, 2019, received for corresponding Chinese Application No. 201711176769.9, 12 pages.

*Primary Examiner* — Roshn K Varghese
(74) *Attorney, Agent, or Firm* — Kinney & Lange, P.A.

(57) ABSTRACT

A substrate, a display device including the substrate and a method of manufacturing the substrate are disclosed. The substrate includes: a base substrate; an overcoat layer on the base substrate; and a spacer on a surface of the overcoat layer facing away from the base substrate. The spacer is in direct contact with the surface of the overcoat layer facing away from the base substrate.

8 Claims, 4 Drawing Sheets

(56) References Cited

U.S. PATENT DOCUMENTS

| | | | |
|---|---|---|---|
| 2005/0110922 A1* | 5/2005 | Lee | G02F 1/133512 349/106 |
| 2005/0134763 A1* | 6/2005 | Kang | G02F 1/133514 349/106 |
| 2006/0081844 A1* | 4/2006 | Hirosue | H01L 27/12 257/59 |
| 2008/0284964 A1* | 11/2008 | Mun | G02F 1/133707 349/139 |
| 2011/0085103 A1* | 4/2011 | Yang | G02F 1/136209 349/43 |
| 2014/0253856 A1* | 9/2014 | Nakahata | H01L 51/525 349/139 |
| 2015/0331161 A1 | 11/2015 | Wang et al. | |

\* cited by examiner

SUBSTRATE, METHOD OF MANUFACTURING THE SAME AND DISPLAY DEVICE

CROSS-REFERENCE TO RELATED APPLICATION

This application claims the benefit of Chinese Patent Application No. 201711176769.9 filed on Nov. 22, 2017 in the State Intellectual Property Office of China, the whole disclosure of which is incorporated herein by reference.

TECHNICAL FIELD

The present disclosure relates to the field of display technology, and in particular, to a substrate, a method of manufacturing the substrate, and a display device.

DESCRIPTION OF THE RELATED ART

At present, OLED display devices have received more and more attention due to excellent use performances. According to different directions of light emitted from the OLED display devices, the OLED display devices may be mainly classified into two different structures: one is a bottom-emission OLED device and the other is a top-emission OLED device. In the bottom-emission OLED device, only a part of light is emitted from apertures on an array substrate and most of the light is wasted. Moreover, the bottom-emission OLED device has a low aperture ratio, and the aperture ratio will decrease as a resolution of the OLED device is increased. In the top-emission OLED device, the light is emitted from a top of the device without being affected by thin film transistors (TFTs) on the array substrate. Thus, an aperture ratio of the top-emission OLED device may be effectively increased, theoretically up to 100%, which is favorable for an integration of the OLED device and circuits. Therefore, in a future manufacture of a large-size, high-resolution display device, it is required to focus on a research of a top-emission active matrix organic light-emitting device (AM-OLED), which requires a cooperation of the OLED device with the thin-film transistors (TFTs).

SUMMARY

According to an aspect of the present disclosure, a substrate is provided including: a base substrate; an overcoat layer on the base substrate; and a spacer on a surface of the overcoat layer facing away from the base substrate. The spacer is in direct contact with the surface of the overcoat layer facing away from the base substrate.

For example, the substrate further includes an electrode on the surface of the overcoat layer facing away from the base substrate.

For example, the electrode includes: a transparent conductive oxide electrode on the surface of the overcoat layer facing away from the base substrate, the transparent conductive oxide electrode covering the spacer; and a metal electrode on a surface of the transparent conductive oxide electrode facing away from the base substrate.

For example, the metal electrode includes a first transparent metal planar electrode or a plurality of metal sub-electrodes spaced apart from each other in a first direction.

For example, the substrate further includes a first film layer between the base substrate and the overcoat layer, and the first film layer includes a black matrix and color filters, the black matrix and the color filters being in the same layer.

For example, an orthographic projection of each of the plurality of the metal sub-electrodes on the base substrate is located within an orthogonal projection of the black matrix on the base substrate.

For example, the electrode consists of a second transparent metal planar electrode.

For example, a material of the overcoat layer includes organic material, and a material of the spacer includes organic material.

For example, the material of the overcoat layer includes resin, silicon-on-glass, benzocyclobutene or optical adhesive.

For example, the material of the spacer includes polyimide or resin.

For example, the electrode covers the spacer.

For example, the substrate further includes a first film layer between the base substrate and the overcoat layer, and the first film layer includes a black matrix and color filters, the black matrix and the color filters being in the same layer.

For example, the black matrix defines a plurality of opening regions, and the color filters are disposed in the respective opening regions and cover edges of the black matrix.

For example, an orthographic projection of the spacer on the base substrate is located within an orthogonal projection of the black matrix on the base substrate.

According to another aspect of the present disclosure, it is provided a display device including the substrate as described above.

According to a further aspect of the present disclosure, it is provided a method of manufacturing a substrate including:
forming an overcoat layer on a base substrate; and
forming a spacer on a surface of the overcoat layer facing away from the base substrate in such a way that the spacer is in direct contact with the surface of the overcoat layer facing away from the base substrate.

For example, the method further includes: forming an electrode on the surface of the overcoat layer facing away from the base substrate.

For example, the forming an electrode on the surface of the overcoat layer facing away from the base substrate includes:
forming a transparent conductive oxide electrode covering the spacer on the surface of the overcoat layer facing away from the base substrate; and
forming a metal electrode on a surface of the transparent conductive oxide electrode facing away from the base substrate.

For example, the forming a metal electrode on a surface of the transparent conductive oxide electrode facing away from the base substrate includes:
forming a layer of metal electrode on the surface of the transparent conductive oxide electrode facing away from the base substrate; and
patterning the layer of metal electrode to form a plurality of metal sub-electrodes spaced apart from each other in a first direction.

For example, the forming a metal electrode on a surface of the transparent conductive oxide electrode facing away from the base substrate includes:
forming a layer of transparent metal electrode on the surface of the transparent conductive oxide electrode facing away from the base substrate.

For example, the forming an electrode on the surface of the overcoat layer facing away from the base substrate includes:

forming a layer of transparent metal electrode on the surface of the overcoat layer facing away from the base substrate.

DETAILED DESCRIPTION OF PREFERRED EMBODIMENTS

Embodiments of the present disclosure will be described in detail below. The embodiments described below are only used to explain the present disclosure exemplarily, and should not be construed as limiting the present disclosure. If specific techniques or conditions are not indicated in the embodiments, they are performed according to the techniques or conditions described in literatures in the related art or according to product specifications. If reagents or instruments used in the embodiments are not indicated by the manufacturers, they are all typical products that may be commercially available.

The inventors have realized that a top-emission OLED display device may be manufactured with reference to a structure of an LCD display device. For example, a top-emission structure may be achieved by a process of aligning and assembling an array substrate and a color filter substrate. Such a top-emission OLED display device typically includes a color filter substrate for the display device. On the color filter substrate, a transparent metal electrode is typically disposed on a surface of an overcoat layer, and a spacer is disposed on a surface of the transparent metal electrode facing away from the overcoat layer. The inventors have further realized that there are some process problems in manufacturing such a top-emission OLED display device with the above structure. For example, in designing the color filter substrate, the following problems may occur: how to achieve an accurate assembly of the array substrate and the color filter substrate, and how to reduce a risk of short-circuiting metal wirings to improve the product yield rate. For example, the following problem may occur: how to increase an adhesive force between the overcoat layer and the transparent metal electrode so as to avoid the transparent metal electrode falling off. For example, the following problem may occur: how to increase an adhesive force between the spacer and the transparent metal electrode so as to avoid the spacer falling off. For example, the following problem may occur: how to reduce a resistance of the metal wirings. With regard to at least one of the above problems, the inventors have conducted deep research and have found that the adhesive force between the spacer and the overcoat layer may be effectively increased by disposing directly the spacer on a surface of the overcoat layer, so as to prevent the spacer from falling off. In this way, it may effectively avoid the problem that the spacer may easily fall off the transparent metal electrode.

In one aspect of the present disclosure, the present disclosure provides a substrate. For convenience of description, the substrate according to the present disclosure will be described by taking a color filter substrate as an example, but it should be understood by those skilled in the art that the substrate according to the present disclosure is not limited to the color filter substrate.

Figure 1:
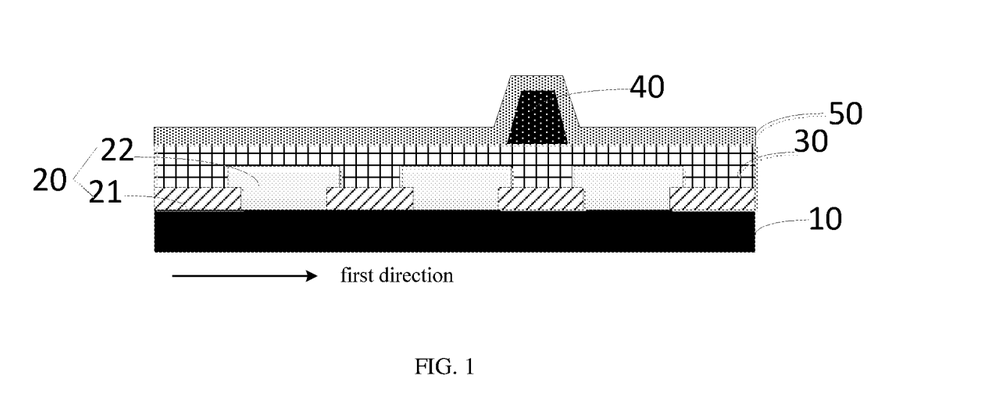
FIG. 1 is a schematic structural view of a substrate (e.g., a color filter substrate) according to an embodiment of the present disclosure.

According to an embodiment of the present disclosure, referring to FIG. 1, the color filter substrate may include: a base substrate 10; a first film layer 20 on a first surface of the base substrate 10; an overcoat layer 30 on a surface of the first film layer 20 facing away from the base substrate 10; a spacer 40 on a surface of the overcoat layer 30 facing away from the base substrate 10; and an electrode 50 on the surface of the overcoat layer 30 facing away from the base substrate 10. The first film layer 20 may include a black matrix 21 and color filters 22, and the black matrix 21 and the color filters 22 may be disposed in the same layer. In an example, the electrode 50 may cover the spacer 40. In the embodiment, the spacer is disposed directly on the surface of the overcoat layer, that is, the spacer is in direct contact with the surface of the overcoat layer facing away from the base substrate. As a material of the overcoat layer is similar to a material of the spacer, the adhesive force between the spacer and the overcoat layer is large, so that the spacer is firmly attachable onto the surface of the overcoat layer and is not easy to fall off, thereby increasing the product yield rate. Moreover, the above-mentioned color filter substrate is simple in structure, easy to implement, and relatively cost-effective. Further, the electrode may effectively serve to protect the spacer and play a role of electrical conduction.

According to an embodiment of the present disclosure, the material of the overcoat layer is not particularly limited, as long as the first film layer is effectively covered and the surface of the overcoat layer facing away from the first film layer is planar, and those skilled in the art may flexibly select the material of the overcoat layer according to actual needs. For example, the material of the overcoat layer may include, but is not limited to, resin, silicon-on-glass (SOG), benzocyclobutene (BCB), etc., wherein the resin may include an optical adhesive or the like.

According to an embodiment of the present disclosure, the material of the spacer is not particularly limited, as long as the spacer may effectively play a supporting role or have suitable mechanical properties, and those skilled in the art may flexibly select the material of the spacer according to actual needs. For example, the material of the spacer may include, but is not limited to, polyimide, resin or the like. In this way, the material of the spacer may be selected within a wide range, thereby achieving a good elasticity and a good supporting effect.

According to an embodiment of the present disclosure, both the material of the spacer and the material of the overcoat layer may be organic material, so that the material of the spacer is similar in properties to the material of the overcoat layer. According to a principle that similar materials exhibit a compatibility therebetween, the adhesive force between the spacer and the overcoat layer may be large by disposing the spacer directly on the surface of the overcoat layer, thereby effectively preventing the spacer from falling off and improving the product yield rate.

According to an embodiment of the present disclosure, a shape of the spacer is not particularly limited as long as it may effectively play a supporting role, and those skilled in the art may flexibly select the shape of the spacer according to actual needs. For example, the shape of the spacer may be a columnar shape such that the spacer may play a good supporting role and make a cell thickness relatively uniform. According to an embodiment of the present disclosure, it is possible to dispose several spacers, and the number of the spacers is also not particularly limited, as long as the spacers may play a good supporting role, and those skilled in the art may flexibly select the number of the spacers according to actual needs.

According to an embodiment of the present disclosure, a type of the electrode is not particularly limited, as long as requirements are satisfied, and those skilled in the art may flexibly select the type of the electrode according to actual needs. For example, the type of the electrode may include, but is not limited to, a transparent metal electrode, or a transparent metal oxide electrode, or a combination of both, or an opaque metal electrode, or the like.

In the embodiment, the first film layer 20 includes the black matrix 21 and the color filters 22 which are both disposed in the same layer. However, embodiments of the present disclosure are not limited thereto. In an alternative embodiment, the first film layer may also include other structures besides the color filters.

In the embodiment, the electrode 50 covers the spacer 40 to protect the spacer. However, embodiments of the present disclosure are not limited thereto. In an alternative embodiment, the electrode may not cover the spacer.

According to an embodiment of the present disclosure, a structure of the transparent electrode is not particularly limited as long as the requirements may be met, and those skilled in the art may flexibly select the structure of the transparent electrode according to actual needs. In some embodiments of the present disclosure, referring to FIG. 2 and FIG. 3, the electrode 50 includes a transparent conductive oxide electrode 51 and a metal electrode 52. The transparent conductive oxide electrode 51 is disposed on a surface of the overcoat layer 30 facing away from the base substrate 10, and covers the spacer 40. The metal electrode 52 is disposed on a surface of the transparent conductive oxide electrode 51 facing away from the base substrate 10. Thus the structure is simple and easy to implement. Moreover, the transparent electrode may have both high light transmittance and good conductive property, and may effectively protect the spacer. Further, as the metal electrode is similar in properties as the transparent conductive oxide electrode, the metal electrode is disposed on the surface of the transparent conductive oxide electrode to obtain a good adhesiveness, so that it is not easy for the metal electrode to fall off and the metal electrode may be tightly and firmly attached to the transparent conductive oxide electrode. In this way, an improved product yield rate, a simplified manufacturing process, a low cost, and a good use performance may be obtained.

According to an embodiment of the present disclosure, a material of the transparent conductive oxide electrode is not particularly limited as long as it may effectively play an electrically conductive role, and those skilled in the art may flexibly select the material of the transparent conductive oxide electrode according to actual needs. For example, the material of the transparent conductive oxide electrode may include, but is not limited to, aluminum-doped zinc oxide (AZO), aluminum zinc tin oxide (AZTO), indium tin oxide (ITO), or fluorine-doped tin oxide (FTO), etc. . . .

According to an embodiment of the present disclosure, a structure of the metal electrode is not particularly limited as long as requirements on the metal electrode is satisfied, and those skilled in the art may flexibly select the structure of the metal electrode according to actual needs. In some embodiments of the present disclosure, referring to FIG. 3, the metal electrode 52 may consist of a first transparent metal planar electrode 522. In this way, the structure is simple and easy to implement, the conductive property is good and the use performance is excellent. In other embodiments of the present disclosure, referring to FIG. 2, the metal electrode 52 may consist of a plurality of metal sub-electrodes 521, and the plurality of metal sub-electrodes 521 are spaced apart from each other in a first direction. Therefore, the structure is simple and easy to implement, and the conductive performance is good. Moreover, the metal sub-electrodes which are spaced apart from each other may increase light transmittance, and thus the use performance is excellent.

According to an embodiment of the present disclosure, a material of the metal electrode is not particularly limited as long as requirements on the metal electrode is satisfied, and those skilled in the art may flexibly select the material of the metal electrode according to actual needs. When the metal electrode consists of the first transparent metal planar electrode, the material of the metal electrode may include, but is not limited to, Ag, Al, Mg, Ca, Sm, Ba, etc., or alloys thereof, such as Mg/Ag, Ca/Ag, Sm/Ag, Al/Ag, Ba/Ag, etc. . . . In this way, the metal electrode has a wide range of material sources and a large process tolerance, and the above materials have good conductivity and excellent use performance. When the metal electrode consists of a plurality of metal sub-electrodes 521 which are spaced apart from each other in the first direction, the material of the metal electrode may include, but is not limited to, common metals such as Mo, Al, Ti, Au, Cu, Hf, Ta, etc., or alloys such as AlNd, MoNb, etc., and may also include multilayered metals such as MoNb/Cu/MoNb, AlNd/Mo/AlNd, and the like. In this way, the metal electrode has a wide range of material sources and a large process tolerance.

According to an embodiment of the present disclosure, the above-mentioned metal sub-electrode may be a transparent electrode or an opaque electrode. When the metal sub-electrode is an opaque electrode, Cu metal process may be used to facilitate reducing a resistance of metal wirings.

Figure 2:
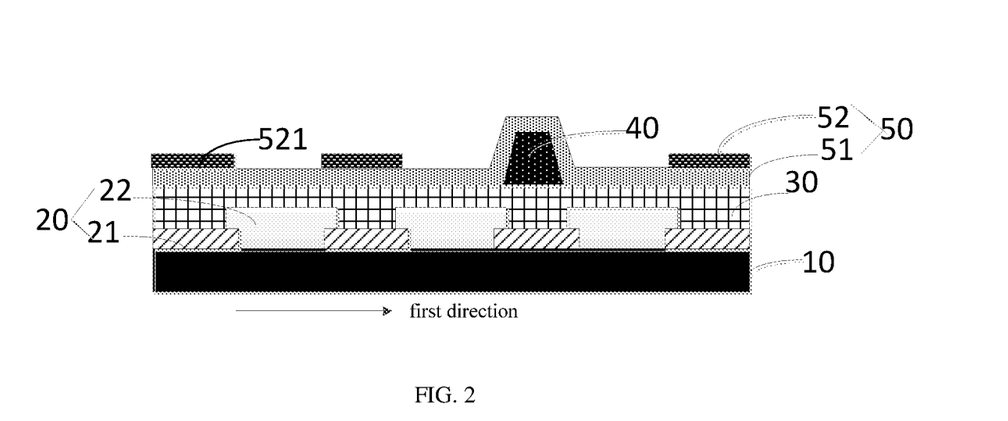
FIG. 2 is a schematic structural view of a substrate according to another embodiment of the present disclosure.
Figure 3:
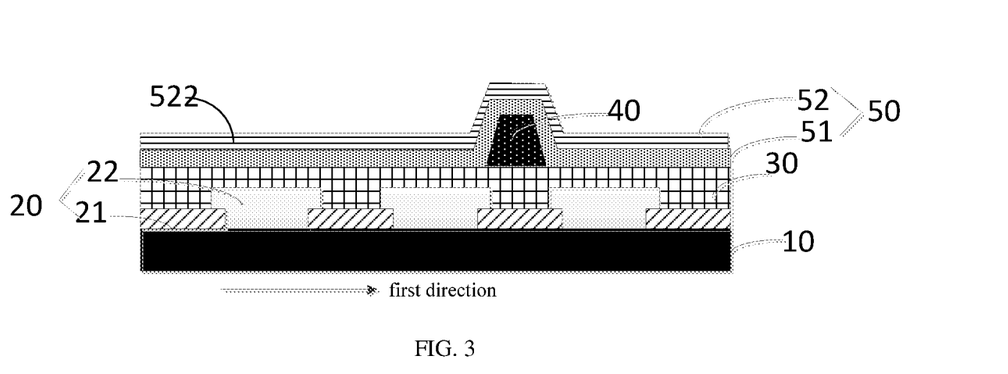
FIG. 3 is a schematic structural view of a substrate according to a further embodiment of the present disclosure.

According to an embodiment of the present disclosure, in order to improve the display quality and not to affect emission of light, referring to FIG. 2, an orthogonal projection of the black matrix 21 on the base substrate 10 covers an orthogonal projection of the metal sub-electrode 521 on the base substrate 10. In this way, the metal sub-electrodes do not affect the emission of light and have good conductive properties. As a result, the display quality is effectively improved and the use performance is excellent. Furthermore, the metal sub-electrodes may be transparent or opaque, and thus have a wide range of material selection, good electrical conductivity, thereby improving effectively display quality and use performance.

Figure 4:
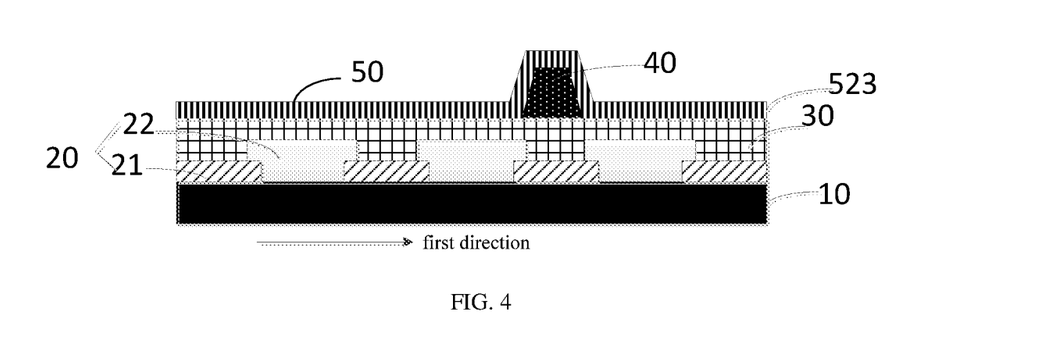
FIG. 4 is a schematic structural view of a substrate according to another further embodiment of the present disclosure.

In other embodiments of the present disclosure, referring to FIG. 4, the electrode 50 may consist of a second transparent metal planar electrode 523. The second transparent metal planar electrode 523 is disposed on a surface of the overcoat layer 30 facing away from the base substrate 10. The second transparent metal planar electrode 523 may cover the spacer 40. In this way, the structure is simple and easy to implement, and the second transparent metal planar electrode may play roles of electrical conduction and protecting the spacer.

According to an embodiment of the present disclosure, a material of the second transparent metal planar electrode is not particularly limited as long as requirements on the metal electrode is satisfied, and those skilled in the art may flexibly select the material of the metal electrode according to actual needs. The material of the second transparent metal planar electrode may include, but is not limited to, Ag, Al, Mg, Ca, Sm, Ba, etc., or alloys thereof, such as Mg/Ag, Ca/Ag, Sm/Ag, Al/Ag, Ba/Ag, etc. . . . In this way, the second transparent metal planar electrode has a wide range of material sources and a large process tolerance, and the above materials have good conductivity and excellent use performance.

According to an embodiment of the present disclosure, in order to effectively prevent light leakage and realize color display, black matrix and color filters are disposed in the first film layer. Referring to FIG. 1, the black matrix 21 defines a plurality of opening regions. The color filters 22 are disposed in the opening regions and cover edges of the black matrix 21. The color filters 22 cover edges of the black matrix 21 so that light passing through the opening regions may be effectively filtered by the color filters 22. As a result, the light leakage phenomenon may be reduced, the display quality of the display device including the above color filter substrate may be improved, and consumer experience may be improved.

According to an embodiment of the present disclosure, referring to FIG. 1, an orthogonal projection of the black matrix 21 on the base substrate 10 covers an orthographic projection of the spacer 40 on the base substrate 10. Also, a width of the spacer 40 in the first direction is less than or equal to a distance between two adjacent opening regions. Since the width of the spacer is less than or equal to the distance between the two adjacent opening regions, the transmission of light is not affected by the spacer, thus the transmittance is high and the use performance is excellent.

According to an embodiment of the present disclosure, a material of the black matrix is not particularly limited as long as the light leakage phenomenon may be effectively avoided, and those skilled in the art may flexibly select the material of the black matrix according to actual needs. For example, the material of the black matrix may include, but is not limited to, resin doped with black pigment, metal, or photoresist doped with metal or carbon, etc. . . .

According to an embodiment of the present disclosure, colors and arrangements of the color filters are not particularly limited, as long as the display requirements may be met, and those skilled in the art may flexibly select the colors and the arrangements of the color filters according to actual needs. For example, the colors of the color filters may include red, blue, green, yellow and the like, or the color filters may be transparent. Distribution manners of the color filters of different colors are also not particularly limited as long as the color display may be effectively realized, and those skilled in the art may flexibly select the distribution manners according to actual needs.

According to an embodiment of the present disclosure, the material of the base substrate is not particularly limited as long as the requirements on light transmission may be satisfied, and those skilled in the art may flexibly select the material of the base substrate according to actual needs. For example, the material of the base substrate may include, but is not limited to, glass, transparent metal, resin, polyimide, or the like.

In another aspect of the present disclosure, the present disclosure provides a display device. According to an embodiment of the present disclosure, the display device includes the aforementioned color filter substrate. The display device includes all the features and advantages of the color filter substrate described above, which will not be described in detail herein, and the display device may have good display quality and excellent use performance.

According to an embodiment of the present disclosure, the display device includes, in addition to the color filter substrate described above, structures of a common display device, such as an array substrate, OLED display elements or liquid crystal display elements, a circuit, or an encapsulation layer. According to an embodiment of the present disclosure, the display device may be a computer, a television, a mobile phone, a tablet computer, a wearable device, or an on-vehicle display, etc. . . . The display device may be widely used.

In yet another aspect of the present disclosure, the present disclosure provides a method of manufacturing a substrate. Consistent with the substrate as described above, the method of manufacturing a substrate according to the present disclosure will be described by taking a color filter substrate as an example for convenience of description, but those skilled in the art should understand that the method according to the present disclosure is not limited to manufacturing the color filter substrate.

Figure 5:
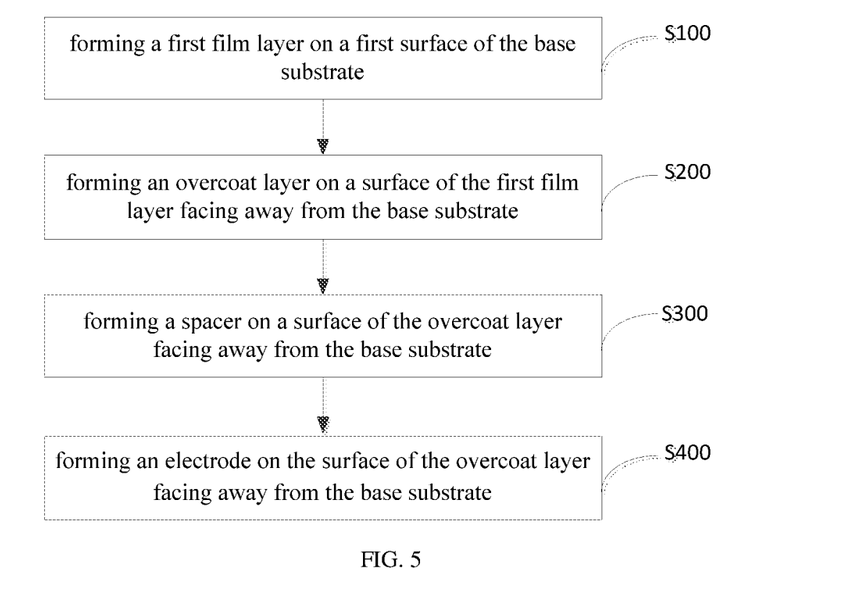
FIG. 5 is a flowchart of a method of manufacturing a substrate according to an embodiment of the present disclosure.
Figure 6:
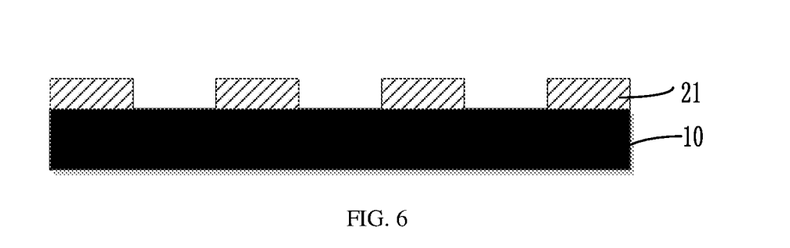
FIG. 6 and FIG. 7 are schematic views of structures formed in step S100 of the method according to an embodiment of the present disclosure.
Figure 7:
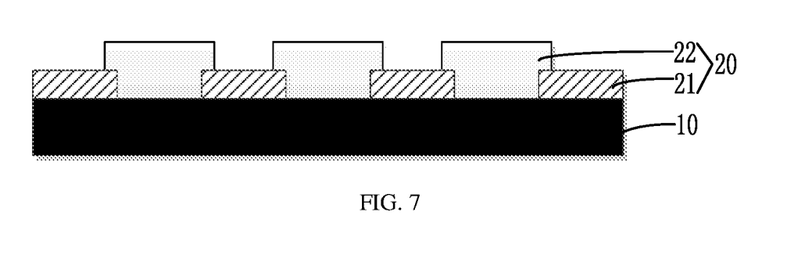

According to an embodiment of the present disclosure, referring to FIG. 5, the method may include:

S100: forming a first film layer 20 on a first surface of the base substrate 10. The schematic structural views showing this step may refer to FIG. 6 and FIG. 7.

According to an embodiment of the present disclosure, the base substrate and the first film layer are consistent with the foregoing descriptions, and are not further described herein.

It should be noted that a second surface of the base substrate opposite to the first surface is a surface facing the user when in use.

According to an embodiment of the present disclosure, the forming a first film layer includes steps of forming a black matrix and color filters. The step of forming the black matrix may be performed before forming the color filters as long as the color filters may cover the edges of the black matrix. There is no particular limitation on the manner of forming the black matrix or the color filters, as long as the requirements may be met, and those skilled in the art may choose flexibly the manner of forming the black matrix or the color filters according to actual needs, for example, the step of forming the black matrix and the step of forming the color filters may be independently performed by means of sputtering, coating, printing, ink jetting, electroplating, photolithography or the like.

Figure 8:
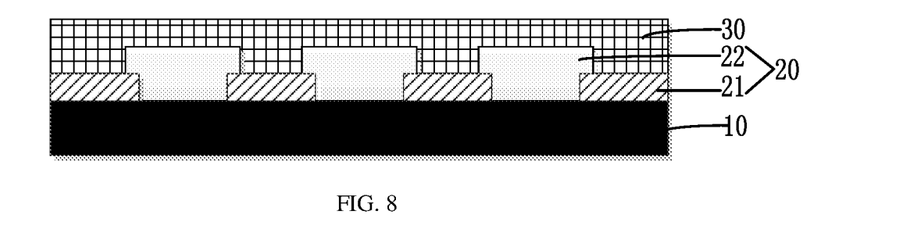
FIG. 8 is a schematic view of a structure formed in step S200 of the method according to an embodiment of the present disclosure.

The method may further include: S200: forming an overcoat layer 30 on a surface of the first film layer 20 facing away from the base substrate 10. The schematic structural view showing this step may refer to FIG. 8.

According to an embodiment of the present disclosure, the overcoat layer is consistent with the foregoing descriptions, and is not further described herein.

According to the embodiment of the present disclosure, the manner of forming the overcoat layer is not particularly limited as long as a surface of the overcoat layer may be made relatively flat, and those skilled in the art may flexibly select the manner of forming the overcoat layer according to actual needs. For example, the forming the overcoat layer may include: coating the surface of the first film layer facing away from the base substrate with a material forming the overcoat layer, and performing heating or light irradiation on the material forming the overcoat layer to harden the material.

Figure 9:
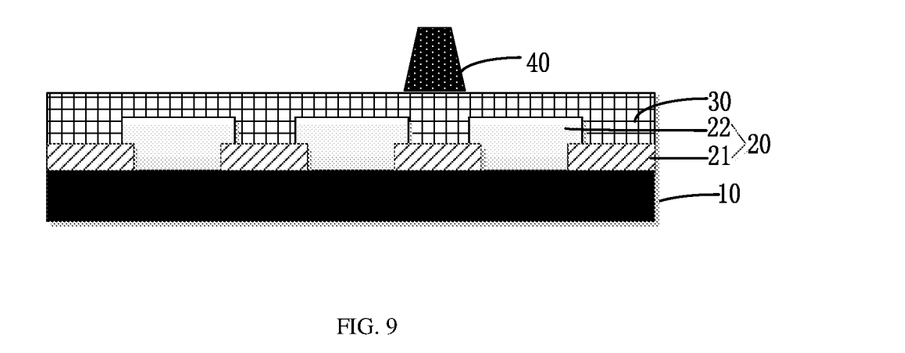
FIG. 9 is a schematic view of a structure formed in step S300 of the method according to an embodiment of the present disclosure.

The method may further include: S300: forming a spacer 40 on a surface of the overcoat layer 30 facing away from the base substrate 10. The schematic structural view showing this step may refer to FIG. 9.

According to an embodiment of the present disclosure, the spacer is consistent with the foregoing descriptions, and is not further described herein.

According to an embodiment of the present disclosure, the manner of forming the spacer is not particularly limited as long as the spacer may be effectively adhered to the surface of the overcoat layer, and those skilled in the art may flexibly select the manner of forming the spacer according to actual needs. In some embodiments of the present disclosure, forming the spacer may include: disposing a material forming the spacer on the surface of the overcoat layer facing away from the base substrate, and then forming the spacer by means of photolithography or cutting or the like.

The method may further include: S400: forming an electrode 50 on the surface of the overcoat layer 30 facing away from the base substrate 10. The electrode 50 may cover the spacer 40. The schematic structural view showing this step may refer to FIG. 1.

In this way, the operations in the method are simple and convenient, and easy to implement, and the electrode has good conductivity and excellent use performance.

According to the embodiment of the present disclosure, the electrode is consistent with the foregoing descriptions, and is not repeated herein.

According to the embodiment of the present disclosure, the manner of forming the electrode is not particularly limited, as long as the electrode is conductive, those skilled in the art may flexibly select the manner of forming the electrode according to actual needs, for example, the electrode may be formed by deposition, sputtering, printing, coating, or the like.

The inventors have found that the method of manufacturing the color filter substrate is simple, convenient and easy to implement, and the spacer is formed on the surface of the overcoat layer, so that the spacer may be closely bound to the overcoat layer, that is, the adhesive force therebetween is large. In this way, the spacer is not easy to fall off, thereby increasing product yield rate and saving cost.

According to an embodiment of the present disclosure, the forming the electrode includes: forming a transparent conductive oxide electrode 51 covering the spacer 40 on the surface of the overcoat layer 30 facing away from the base substrate 10; and forming metal electrodes 52 on a surface of the transparent conductive oxide electrode 51 facing away from the substrate 10. The schematic structural view may refer to FIG. 2. In this way, operations for forming the electrode are simple, convenient, and easy to implement. The metal electrodes are located on the surface of the transparent conductive oxide electrode so that the adhesive force is large and the metal electrodes are not easy to fall off, thereby increasing the product yield rate. Moreover, the metal electrodes are disposed on the surface of the transparent conductive oxide electrode so that the conductivity and the display quality of the display device may be improved.

According to an embodiment of the present disclosure, the transparent conductive oxide electrode and the metal electrodes are consistent with the foregoing descriptions, and are not repeated herein. According to the embodiment of the present disclosure, the manner of forming the transparent conductive oxide electrode is not particularly limited, and may include, but is not limited to, deposition, sputtering, printing, coating, or the like. The manner of forming the metal electrodes is not particularly limited, and may include, but is not limited to, deposition, sputtering, etching, coating or the like. Those skilled in the art may flexibly select the manners of forming the transparent conductive oxide electrode and the metal electrode according to actual needs, as long as the requirements may be met.

In a color filter substrate of a common display device, a spacer is disposed on a metal electrode, and the metal electrode is disposed on an overcoat layer. Since there is a poor bonding ability between the spacer and the metal electrode and a poor bonding ability between the metal electrode and the overcoat layer, the spacer and the metal electrode are easy to fall off, resulting in a low product yield rate and a low display quality of the display device. Thus, applications of the color filter substrate are limited. In the embodiments of the present disclosure, the material of the spacer and the material of the overcoat layer are similar in properties, and the material of the transparent conductive oxide electrode and the material of the metal electrode are similar in properties. Also, the spacer is disposed on the overcoat layer and the metal electrodes are disposed on the transparent conductive oxide electrode. In this way, the spacer is effectively bonded to the overcoat layer and the metal electrodes are effectively bonded to the transparent conductive oxide electrode according to the principle that similar materials exhibit a compatibility therebetween. As a result, the spacer and the metal electrodes are not easy to fall off, thereby increasing the product yield rate, simplifying a process, and effectively saving cost.

The method of manufacturing the color filter substrate according to the embodiments of the present disclosure will be described in further detail below in conjunction with specific examples.

For example, referring to FIG. 6 to FIG. 9 and FIG. 2, the electrode 50 includes a transparent conductive oxide electrode 51 and metal sub-electrodes 521. The metal sub-electrodes 521 are disposed at intervals in the first direction. The method of manufacturing the color filter substrate may be performed as follows:

cleaning the glass substrate 10, and forming black matrix 21, color filters 22, and an overcoat layer 30 successively on the glass substrate 10, the forming the color filters 22 including: depositing red (R) color filter, green (G) color filter, and blue (B) color filter successively in such a way that the color filters cover a part of the black matrix 21;

depositing a material of the spacer 40 on the overcoat layer 30 and patterning the material of the spacer so that a pattern of the spacer 40 is directly above a light-shielding metal pattern (or a pattern of the black matrix 21) and a width of the pattern of the spacer 40 is slightly smaller than a width of the pattern of the black matrix 21;

depositing a film layer of a transparent conductive oxide electrode 51, the transparent conductive oxide material including ITO, AZO, IZO, AZTO, etc., or a combination of these materials such as AZO/ITO;

depositing the metal electrode finally, and patterning the metal electrode to form metal sub-metals spaced apart from each other.

The material of the metal electrode may include common metals such as Mo, Al, Ti, Au, Cu, Hf, Ta, or alloys thereof such as AlNd, MoNb, etc. It may also include multilayered metals such as MoNb/Cu/MoNb, AlNd/Mo/AlNd, and the like.

For example, referring to FIG. 6 to FIG. 9 and FIG. 3, the electrode 50 includes a transparent conductive oxide electrode 51 and a first transparent metal planar electrode 522. The method of manufacturing the color filter substrate may be performed as follows:

cleaning the glass substrate 10, and forming black matrix 21, color filters 22, and an overcoat layer 30 successively on the glass substrate 10, the forming the color filters 22 including: depositing red (R) color filter, green (G) color filter, and blue (B) color filter successively in such a way that the color filters cover a part of the black matrix 21;

depositing a material of the spacer 40 on the overcoat layer 30 and patterning the material of the spacer so that a pattern of the spacer 40 is directly above a pattern of the black matrix 21 and a width of the pattern of the spacer 40 is slightly smaller than a width of the pattern of the black matrix 21;

finally, depositing a film layer of a transparent conductive oxide electrode 51 and a film layer of a transparent metal electrode 522.

The transparent conductive oxide material may include common materials such as ITO, AZO, IZO, AZTO, etc., or a combination of these materials such as AZO/ITO. The transparent metal electrode material may include Ag, Al, Mg, Ca, Sm, or the like, or an alloy thereof, such as Ca/Ag, Sm/Ag, Al/Ag, or the like.

For example, referring to FIG. 6 to FIG. 9 and FIG. 4, the electrode 50 includes a second transparent metal planar electrode 523. The method of manufacturing the color filter substrate may be performed as follows:

cleaning the glass substrate 10, and forming black matrix 21, color filters 22, and an overcoat layer 30 successively on the glass substrate 10, the forming the color filters 22 including: depositing red (R) color filter, green (G) color filter, and blue (B) color filter successively in such a way that the color filters cover a part of the black matrix 21;

depositing the material of the spacer 40 on the overcoat layer 30 and patterning the material of the spacer so that a pattern of the spacer 40 is directly above a pattern of the black matrix 21 and a width of the pattern of the spacer 40 is slightly smaller than a width of the pattern of the black matrix 21;

depositing a film layer of a transparent metal electrode 523 finally.

The transparent metal electrode material may include Ag, Al, Mg, Ca, Sm, or the like, or an alloy thereof, such as Ca/Ag, Sm/Ag, Al/Ag, or the like.

In the descriptions of the present disclosure, it is to be understood that the orientation or positional relationships indicated by the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential" or the like is based on the orientation or positional relationships shown in the drawings, and is merely for convenience of describing the present disclosure and simplified description, but does not indicate or suggest that the indicated device or element must have a particular orientation, be constructed and operated in a particular orientation, and therefore should not be construed to limit the present disclosure.

Furthermore, the terms "first" and "second" are used for descriptive purposes only, and are not to be construed as indicating or implying relative importance or implicitly indicating the number of indicated technical features. Thus, features defined as "first", "second" may explicitly or implicitly include one or more of the features. In the descriptions of the present disclosure, the meaning of "plurality" is two or more than two unless it is specifically defined otherwise.

In the present disclosure, the terms "mount", "connect", "connecting", "fix" or the like shall be understood in a broad sense unless specifically defined or limited otherwise. For example, they may be fixed connections or detachable connections, or integrated; they may be a mechanical connection or an electrical connection; they may be directly connected or indirectly connected through an intermediary element; or they may be an internal communication of two components or an interaction of two elements. Those skilled in the art may understand the specific meanings of the above terms in the present disclosure according to specific circumstances.

In the present disclosure, unless specifically stated and defined otherwise, if a first feature is "above" or "below" a second feature, it is possible that the first and second features are in direct contact, or that the first feature contact indirectly with the second feature via an intermediary element. Also, if the first feature is "on", "above" or "over" a second feature, it is possible that the first feature is directly above or diagonally above the second feature, or may simply indicate that the first feature is higher than the second feature. If the first feature is "below", "under" or "underneath" the second feature, it is possible that the first feature is directly below or diagonally below the second feature, or may merely indicate that a level of the first feature is lower than a level of the second feature.

In the descriptions of the present specification, the description referring to the terms "one embodiment", "some embodiments", "an example", "a specific example", or "some examples" or the like means specific features, structures, materials, or characteristics described in conjunction with the embodiment or example are included in at least one embodiment or example of the present disclosure. In this specification, the schematic description of the above terms does not necessarily refer to the same embodiment or example. Furthermore, the specific features, structures, materials, or characteristics described may be combined in any suitable manner in any one or more of the embodiments or examples. In addition, those skilled in the art may combine the different embodiments or examples described in this specification and features of different embodiments or examples without conflicting with each other.

Although embodiments of the present disclosure have been shown and described above, it will be understood that the above embodiments are exemplary and not to be construed as limiting the present disclosure, and that those skilled in the art may make changes, modifications, substitutions and variations to the embodiments within the scope of the present disclosure.

What is claimed is:

1. A substrate comprising:
   a base substrate;
   an overcoat layer on the base substrate;
   a first film layer between the base substrate and the overcoat layer, the first film layer comprising a black matrix and color filters, the black matrix and the color filters being in the same layer;
   a spacer on a surface of the overcoat layer facing away from the base substrate; and
   an electrode on the surface of the overcoat layer facing away from the base substrate, the electrode covering the spacer;
   wherein a material of the overcoat layer is similar to a material of the spacer;
   wherein the spacer comprises a first surface and a second surface opposite to the first surface, the first surface of the spacer is in direct contact with the surface of the overcoat layer facing away from the base substrate, the second surface of the spacer is in direct contact with a surface of the electrode facing the base substrate, and an orthographic projection of the second surface of the spacer on the base substrate falls into an orthographic projection of the first surface of the spacer on the base substrate,
   wherein the surface of the electrode facing the base substrate is also in direct contact with the surface of the overcoat layer facing away from the base substrate and further in direct contact with sidewalls of the spacer, the sidewalls of the spacer intersecting with both the first surface and the second surface of the spacer;
   wherein the electrode comprises:
      a transparent conductive oxide electrode on the surface of the overcoat layer facing away from the base substrate, the transparent conductive oxide electrode covering the spacer; and
      a metal electrode on a surface of the transparent conductive oxide electrode facing away from the base substrate; and
   wherein the metal electrode comprises a plurality of metal sub-electrodes spaced apart from each other in a first direction, and an orthographic projection of each of the plurality of the metal sub-electrodes on the base substrate is located within an orthogonal projection of the black matrix on the base substrate.

2. The substrate of claim 1, wherein a material of the overcoat layer comprises organic material, and a material of the spacer comprises organic material.

3. The substrate of claim 2, wherein the material of the overcoat layer comprises resin, silicon-on-glass, benzocyclobutene or optical adhesive.

4. The substrate of claim 2, wherein the material of the spacer comprises polyimide or resin.

5. The substrate of claim 1, wherein the black matrix defines a plurality of opening regions, and the color filters are disposed in the respective opening regions and cover edges of the black matrix.

6. The substrate of claim 1, wherein an orthographic projection of the spacer on the base substrate is located within an orthogonal projection of the black matrix on the base substrate.

7. A display device comprising the substrate of claim 1.

8. A method of manufacturing a substrate comprising:
   forming a first film layer on a base substrate, the first film layer comprising a black matrix and color filters, the black matrix and the color filters being in the same layer;
   forming an overcoat layer on a surface of the first film layer facing away from the base substrate;
   forming a spacer on a surface of the overcoat layer facing away from the base substrate, a material of the overcoat layer being similar to a material of the spacer;
   forming an electrode on the surface of the overcoat layer facing away from the base substrate in such a way that the electrode covers the spacer,
   wherein the spacer comprises a first surface and a second surface opposite to the first surface, the first surface of the spacer is in direct contact with the surface of the overcoat layer facing away from the base substrate, the second surface of the spacer is in direct contact with a surface of the electrode facing the base substrate, and an orthographic projection of the second surface of the spacer on the base substrate falls into an orthographic projection of the first surface of the spacer on the base substrate,
   wherein the surface of the electrode facing the base substrate is also in direct contact with the surface of the overcoat layer facing away from the base substrate and further in direct contact with sidewalls of the spacer, the sidewalls of the spacer intersecting with both the first surface and the second surface of the spacer; and
   wherein forming the electrode on the surface of the overcoat layer facing away from the base substrate comprises:
      forming a transparent conductive oxide electrode covering the spacer on the surface of the overcoat layer facing away from the base substrate;
      forming a layer of metal electrode on the surface of the transparent conductive oxide electrode facing away from the base substrate; and
      patterning the layer of metal electrode to form a plurality of metal sub-electrodes spaced apart from each other in a first direction so that an orthographic projection of each of the plurality of the metal sub-electrodes on the base substrate is located within an orthogonal projection of the black matrix on the base substrate.

* * * * *